United States Patent
Asano et al.

(10) Patent No.: US 10,879,402 B2
(45) Date of Patent: Dec. 29, 2020

(54) THIN FILM TRANSISTOR AND DISPLAY UNIT

(71) Applicant: JOLED INC., Tokyo (JP)

(72) Inventors: Naoki Asano, Tokyo (JP); Tokuaki Kuniyoshi, Tokyo (JP)

(73) Assignee: JOLED INC., Tokyo (JP)

( * ) Notice: Subject to any disclaimer, the term of this patent is extended or adjusted under 35 U.S.C. 154(b) by 82 days.

(21) Appl. No.: 16/150,278

(22) Filed: Oct. 3, 2018

(65) Prior Publication Data

US 2019/0259878 A1 Aug. 22, 2019

(30) Foreign Application Priority Data

Feb. 16, 2018 (JP) ................. 2018-025959

(51) Int. Cl.
*H01L 29/786* (2006.01)
*G09G 3/20* (2006.01)
*H01L 29/423* (2006.01)
*H01L 29/417* (2006.01)
*H01L 27/12* (2006.01)

(52) U.S. Cl.
CPC .......... *H01L 29/7869* (2013.01); *G09G 3/20* (2013.01); *H01L 29/41733* (2013.01); *H01L 29/42384* (2013.01); *G09G 2310/08* (2013.01); *H01L 27/1225* (2013.01)

(58) Field of Classification Search
CPC ....... H01L 2029/42388; H01L 29/7869; H01L 29/42384; H01L 29/41733; H01L 27/1225; G09G 3/20; G09G 2310/08
See application file for complete search history.

(56) References Cited

U.S. PATENT DOCUMENTS

| 9,455,349 | B2* | 9/2016 | Suzawa ............ H01L 29/78648 |
| 2009/0261355 | A1 | 10/2009 | Matsukizono et al. |
| 2013/0320328 | A1 | 12/2013 | Lee et al. |
| 2016/0247928 | A1 | 8/2016 | Yamazaki |
| 2017/0117374 | A1 | 4/2017 | Tanaka |

FOREIGN PATENT DOCUMENTS

| JP | H1020337 A | 1/1998 |
| JP | 2009200528 A | 9/2009 |
| JP | 2013251526 A | 12/2013 |
| JP | 2016157938 A | 9/2016 |
| JP | 201785079 A | 5/2017 |
| WO | 2007/032128 A1 | 3/2007 |

* cited by examiner

*Primary Examiner* — Stephen W Smoot
*Assistant Examiner* — Vicki B. Booker
(74) *Attorney, Agent, or Firm* — Hauptman Ham, LLP

(57) ABSTRACT

A thin film transistor includes a substrate, a semiconductor layer, a first gate insulating film, a second gate insulating film, and a gate electrode. The semiconductor layer is provided in a selective region of the substrate. The first gate insulating film is provided in the selective region of the substrate and covers a surface of the semiconductor layer. The second gate insulating film extends across opposite sides of the first gate insulating film along a channel width direction and covers the first gate insulating film that covers the semiconductor layer. The gate electrode faces the semiconductor layer across the second gate insulating film.

17 Claims, 7 Drawing Sheets

THIN FILM TRANSISTOR AND DISPLAY UNIT

CROSS REFERENCE TO RELATED APPLICATIONS

This application claims the benefit of Japanese Priority Patent Application No. 2018-025959 filed on Feb. 16, 2018, the entire contents of which are incorporated herein by reference.

BACKGROUND

The technology relates to a thin film transistor (TFT) including a semiconductor layer and a gate electrode that are provided on a substrate and to a display unit including such a TFT.

A thin transistor film has found its application in a variety of electronic apparatuses, such as a display apparatus. A thin film transistor includes a semiconductor layer, a gate insulating film, a gate electrode, and any other component, on a substrate. Reference is made to International Publication No. WO2007/032128, for example.

SUMMARY

A thin film transistor has been desired which is capable of suppressing characteristic degradation in mobility and S value, for example.

It is desirable to provide a thin film transistor that is able to suppress characteristic degradation and a display unit that includes such a thin film transistor.

A thin film transistor according to one embodiment of the technology includes: a substrate; a semiconductor layer provided in a selective region of the substrate; a first gate insulating film provided in the selective region of the substrate and covering a surface of the semiconductor layer; a second gate insulating film extending across opposite sides of the first gate insulating film along a channel width direction and covering the first gate insulating film that covers the semiconductor layer; and a gate electrode facing the semiconductor layer across the second gate insulating film.

A display unit according to one embodiment of the technology is provided with a display element and a thin film transistor configured to drive the display element. The thin film transistor includes: a substrate; a semiconductor layer provided in a selective region of the substrate; a first gate insulating film provided in the selective region of the substrate and covering a surface of a semiconductor layer; a second gate insulating film extending across opposite sides of the first gate insulating film along a channel width direction and covering the first gate insulating film that covers the semiconductor layer; and a gate electrode facing the semiconductor layer across the second gate insulating film.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
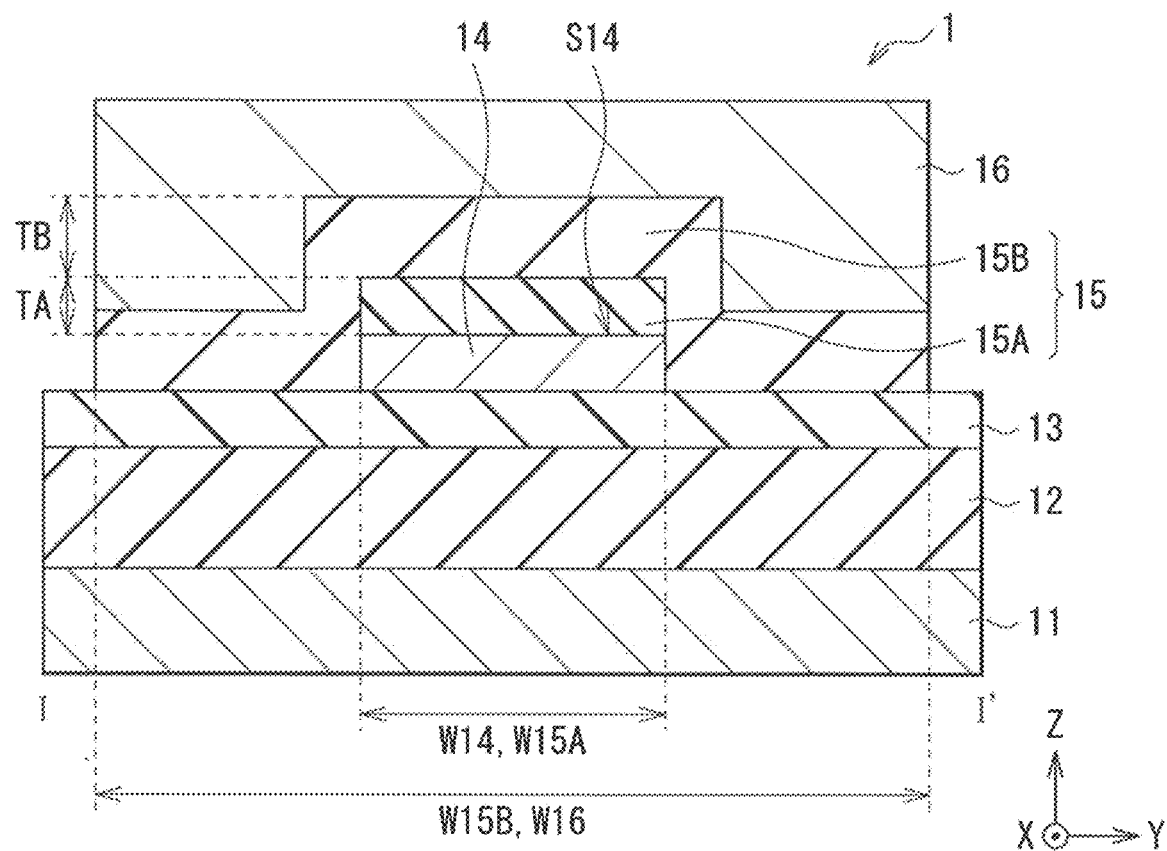
FIG. 1 is a schematic cross-sectional view, taken along a channel width direction, of a thin film transistor having an example configuration according to one embodiment of the technology.

In the following, some preferred but non-limiting embodiments of the disclosure are described in detail with reference to the accompanying drawings. Note that sizes, materials, specific values, and any other factors illustrated in respective embodiments are illustrative for easier understanding of the technology, and are not intended to limit the scope of the technology unless otherwise specifically stated. Further, elements in the following example implementations which are not recited in a most-generic independent claim of the disclosure are optional and may be provided on an as-needed basis. Throughout the present specification and the drawings, elements having substantially the same function and configuration are denoted with the same reference numerals to avoid any redundant description. Further, elements that are not directly related to the technology are unillustrated in the drawings. The drawings are schematic and are not intended to be drawn to scale.

Embodiments

[Configuration]

Figure 2:
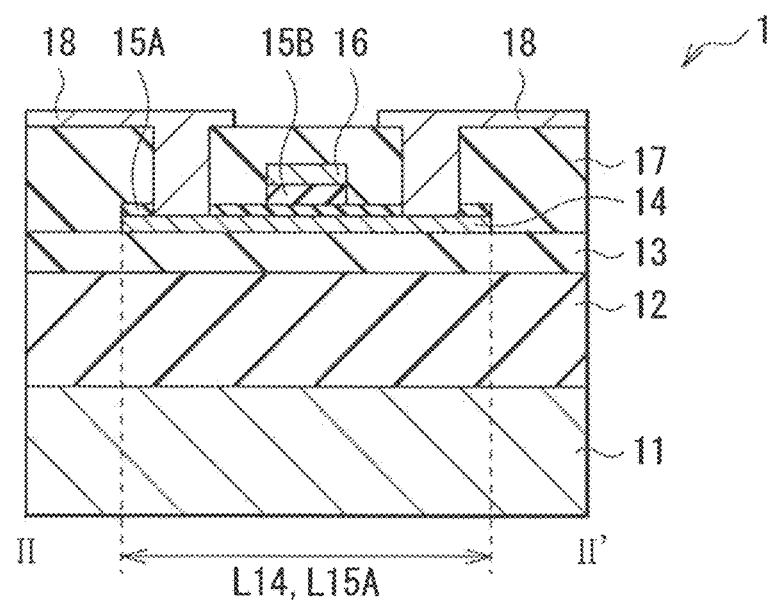
FIG. 2 is a schematic cross-sectional view, taken along a channel length direction, of the thin film transistor illustrated in FIG. 1.
Figure 3:
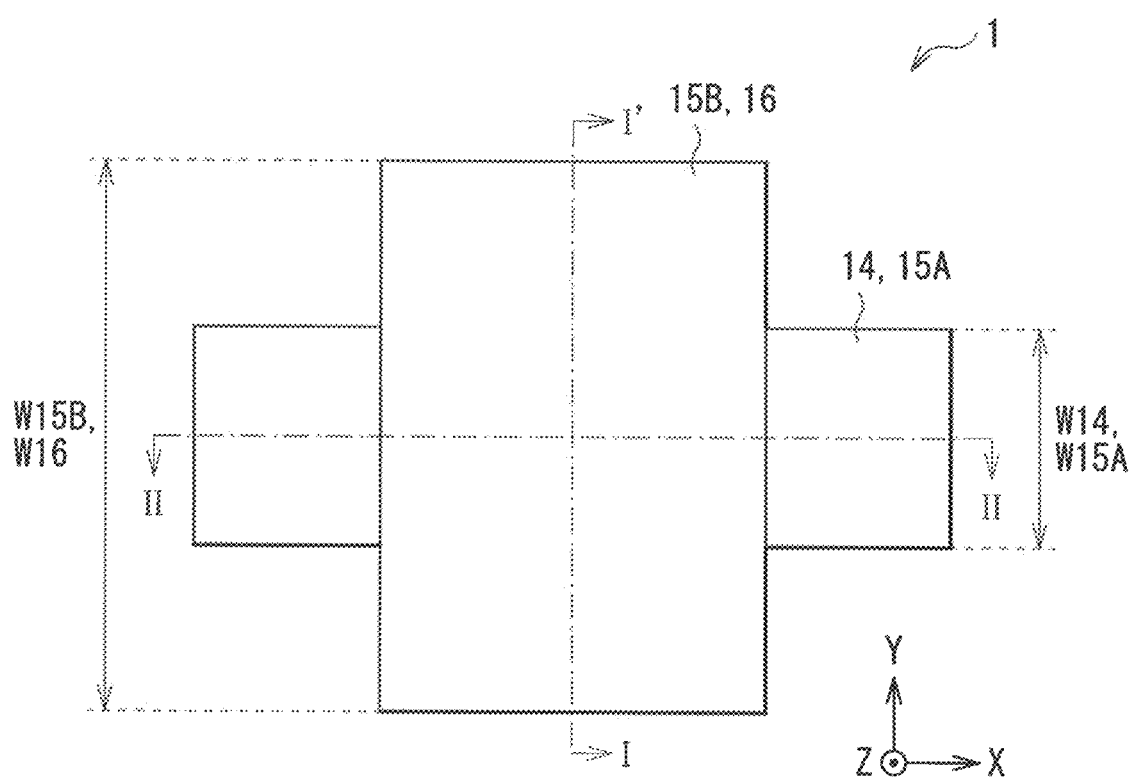
FIG. 3 is a schematic plan view of the thin film transistor illustrated in FIGS. 1 and 2.

FIGS. 1 to 3 each schematically illustrate a thin film transistor 1 having an example configuration according to an embodiment of the technology. FIG. 1 is a cross-sectional view of the thin film transistor 1 taken along a Y-Z plane extending in a channel width direction. FIG. 2 is a cross-sectional view of the thin film transistor 1 taken along an X-Z plane in a channel length direction. FIG. 3 is a plan view of the thin film transistor 1 on an X-Y plane. FIG. 1 illustrates a cross-sectional configuration of the thin film transistor 1 taken along the line I-I' in FIG. 3, and FIG. 2 illustrates a cross-sectional configuration of the thin film transistor 1 taken along the line II-II' in FIG. 3. The thin film transistor 1 may be provided in a driving circuit for a display unit (e.g., a display unit 2A illustrated in FIG. 8 described below) or an imaging unit (e.g., an imaging unit 2B illustrated in FIG. 9 described below), for example. The driving circuit may include, for example, a storage capacitor, as well as the thin film transistor 1.

The thin film transistor 1 may be a top-gate transistor, for example. With reference to FIG. 1, the thin film transistor 1 includes, in this order from a substrate 11, an under coat (UC) film 12, an insulating film 13, a semiconductor layer 14, a gate insulating film 15, and a gate electrode 16. With reference to FIG. 2, the thin film transistor 1 may further include an interlayer insulating film 17 and source-drain electrodes 18 provided in this order on the semiconductor layer 14.

The substrate 11 may include glass, quartz, or silicon, for example. Alternatively, the substrate 11 may include a resin material, such as polyethylene terephthalate (PET), polyimide (PI), polycarbonate (PC), or polyethylene naphthalate (PEN). Instead of these materials, the substrate 11 may include a plate of metal, such as a stainless-steel (SUS), on which an insulating material film is provided.

The UC film 12 suppresses or prevents movement of sodium ions and other substances from the substrate 11 to an upper layer. The UC film 12 may include an insulating material, such as silicon nitride (SiN) or silicon oxide (SiO). For example, the UC film 12 may be a laminate including, in this order from the substrate 11, a silicon nitride (SiN) film and a silicon oxide (SiO) film. The UC film 12 may extend over the entire top surface of the substrate 11.

The insulating film 13 on the UC film 12 may extend over the entire top surface of the substrate 11, for example. The insulating film 13 may be an inorganic insulating film, such as a silicon oxide (SiO) film, a silicon nitride (SiN) film, a silicon oxide nitride (SiON) film, or an aluminum oxide (AlO) film. The insulating film 13 may be provided between the paired electrodes of the storage capacitor.

The semiconductor layer 14 is provided in a selective region of the substrate 11. The insulating film 13 and the UC film 12 may be provided between the semiconductor layer 14 and the substrate 11. The semiconductor layer 14 may have a length $L_{14}$ along an X axis extending in a channel length direction, and a width $W_{14}$ along a Y axis extending in a channel width direction.

The semiconductor layer 14 may include an oxide semiconductor that contains, as a main component, an oxide of one or more of indium (In), gallium (Ga), zinc (Zn), tin (Sn), titanium (Ti), or niobium (Nb), for example. Specific but non-limiting examples of the oxide included in the semiconductor layer 14 may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). Alternatively, the semiconductor layer 14 may include a semiconductor material, such as amorphous silicon, microcrystalline silicon, polycrystalline silicon, or other organic semiconductors. The semiconductor layer 14 may have a thickness in a range from 10 nm to 300 nm, for example. In an embodiment of the technology, the semiconductor layer 14 may have a thickness of 60 nm or less. As the thickness of the semiconductor layer 14 is reduced, an absolute number of defects included in the semiconductor layer 14 is reduced, which suppresses a negative shift of a threshold voltage. This enables achievement of an excellent characteristic, such as a high on/off ratio, of the thin film transistor 1. Further, this reduces formation time of the semiconductor layer 14. This results in an improvement in productivity.

The semiconductor layer 14 may include a channel region and low-resistive regions. The channel region of the semiconductor layer 14 may face the gate electrode 16. The low-resistive regions of the semiconductor layer 14 may each have an electric resistance lower than that of the channel region. The low-resistive regions of the semiconductor layer 14 may be respectively provided on two sides of the channel region along the channel length direction. The source-drain electrodes 18 may be respectively coupled to the low-resistive regions, as illustrated in FIG. 2. A surface $S_{14}$, facing the gate electrode 16, of the semiconductor layer 14 and end faces of the semiconductor layer 14 are covered with the gate insulating film 15. The semiconductor layer 14 may be electrically separated from the gate electrode 16.

In an embodiment of the technology, the gate insulating film 15 provided between the semiconductor layer 14 and the gate electrode 16 includes a first gate insulating film 15A and a second gate insulating film 15B. The first gate insulating film 15A is provided in contact with the surface $S_{14}$ of the semiconductor layer 14. The second gate insulating film 15B covers the first gate insulating film 15A covering the semiconductor layer 14. Such a structure suppresses occurrence of a defect on the surface $S_{14}$ of the semiconductor layer 14 during the manufacturing processing, as described in detail below.

The first gate insulating film 15A provided on the semiconductor layer 14 is provided in the selective region of the substrate 11. The first gate insulating film 15A may be formed in the same process as the semiconductor layer 14, with a resist film (e.g., a resist film R illustrated in FIG. 4C, as described below) used for formation of the semiconductor layer 14. The first gate insulating film 15A covers and protects the surface $S_{14}$ of the semiconductor layer 14, during the manufacturing processing.

In an embodiment of the technology, the first gate insulating film 15A may have a planer shape substantially the same as that of the semiconductor layer 14. The first gate insulating film 15A may have end faces respectively aligned with the end faces of the semiconductor layer 14 in plan view of the X-Y plane, as illustrated in FIGS. 1 to 3. The first gate insulating film 15A may have a width $W_{15A}$ equal to a width $W_{14}$ of the semiconductor layer 14, along the channel width direction, as illustrated in FIGS. 1 to 3. In another embodiment of the technology, the first gate insulating film 15A may extend over a smaller region than the semiconductor layer 14 in a plan view, as a result of processing, for example. In such a case, the first gate insulating film 15A may be provided in a region inward from the selective region of the substrate 11 in which the semiconductor layer 14 is provided.

The second gate insulating film 15B provided between the first gate insulating film 15A and the gate electrode 16 may have a width $W_{15B}$ along the channel width direction. The width $W_{15B}$ of the second gate insulating film 15B along the channel width direction may be greater than the width $W_{15A}$ of the first gate insulating film 15A along the channel width direction. The second gate insulating film 15B may extend over opposite sides of the first gate insulating film 15A along the channel width direction. In other words, the second gate insulating film 15B may cover part of the end faces, oriented in the channel width direction, of the semiconductor layer 14. The second gate insulating film 15B provided between each of the end faces of the semiconductor layer 14 and the gate electrode 16 suppresses occurrence of a short circuit between the gate electrode 16 and each of the end faces of the semiconductor layer 14. In an embodiment of the technology, the second gate insulating film 15B may have a planar shape substantially the same as that of the gate electrode 16, as illustrated in FIG. 3, and the thin film transistor 1 may have a self-aligned structure.

In an embodiment of the technology, the first gate insulating film 15A may have a thickness TA different from the thickness TB of the second gate insulating film 15B, along the Z axis. The total of the thickness TA of the first gate insulating film 15A and the thickness TB of the second gate insulating film 15B may be in a range from 50 to 300 nm, for example. For example, the thickness TA of the first gate insulating film 15A may be greater than the thickness TB of the second gate insulating film 15B. Such a configuration protects the surface $S_{14}$ of the semiconductor layer 14 more securely and suppresses characteristic degradation of the thin film transistor 1 more effectively. Alternatively, the thickness TB of the second gate insulating film 15B may be greater than the thickness TA of the first gate insulating film 15A. Such a configuration suppresses occurrence of a short circuit between the gate electrode 16 and the semiconductor layer 14.

In an embodiment of the technology, the first gate insulating film 15A and the second gate insulating film 15B may include the same insulating material. This simplifies the manufacturing processing. Specific but non-limiting examples of the insulating material of the first gate insulating film 15A and the second gate insulating film 15B may include an inorganic insulating material, such as silicon oxide (SiO), silicon nitride (SiN), silicon nitride oxide (SiON), and aluminum oxide (AlO). In another embodiment of the technology, the first gate insulating film 15A may include a different material from the second gate insulating film 15B.

The gate electrode 16 faces the semiconductor layer 14 across the second gate insulating film 15B. The gate electrode 16 may control a carrier density in the channel region of the semiconductor layer 14 with a gate voltage (Vg) applied thereto, and serve as a wiring line to supply a potential. The gate electrode 16 may have a width $W_{16}$ equal to the width $W_{15B}$ of the second gate insulating film 15B, along the channel width direction, for example. The gate electrode 16 may have end faces respectively aligned with end faces of the second gate insulating film 15B in plan view, as illustrated in FIGS. 1 to 3.

The gate electrode 16 may include a metal containing one of titanium (Ti), tungsten (W), tantalum (Ta), aluminum (Al), molybdenum (Mo), silver (Ag), neodymium (Nd), or copper (Cu), or a metal alloy thereof, for example. Alternatively, the gate electrode 16 may include a compound containing at least one of these elements or a multilayer film including two or more of these elements. The gate electrode 16 may be a transparent electrically-conductive film, such as an ITO film.

The interlayer insulating film 17 may extend over the entire top surface of the substrate substrate 11, for example. For example, the interlayer insulating film 17 may include an inorganic insulating material, such as silicon oxide (SiO), silicon nitride (SiN), silicon oxide nitride (SiON), or aluminum oxide ($Al_2O_3$). Alternatively, the interlayer insulating film 17 may include an organic insulating material, such as polyimide resin, novolak resin, or acrylic resin. Still alternatively, the interlayer insulating film 17 may be a laminate of an inorganic insulating film and an organic insulating film. Note that illustration of the interlayer insulating film 17 is omitted in FIG. 1.

Each of the source-drain electrode 18 provided on the interlayer insulating film 17 may serve as a source or drain of the thin film transistor 1. For example, the source-drain electrodes 18 may be respectively coupled to the low-resistive regions of the semiconductor layer 14 through respective contact holes of the interlayer insulating film 17 and the first gate insulating film 15A. For example, the source-drain electrodes 18 may include the same material as the gate electrode 16. Specific but non-limiting examples of the material of the source-drain electrodes 18 may include the same ones as those described above for the gate electrode 16. In an embodiment of the technology, the source-drain electrodes 18 may include a material having high electrical conductivity.

[Manufacturing Method]

The thin film transistor 1 according to any embodiment of the technology may be manufactured through the following processes illustrated in FIG. 4A to FIG. 4D.

Figure 4A:
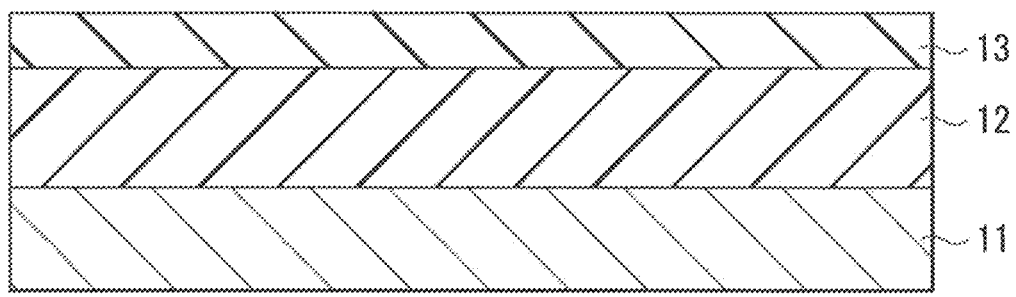
FIG. 4A is a schematic cross-sectional view of the thin film transistor illustrated in FIG. 1, for illustrating an example process of a manufacturing method of the thin film transistor according to one embodiment of the technology.
Figure 4B:
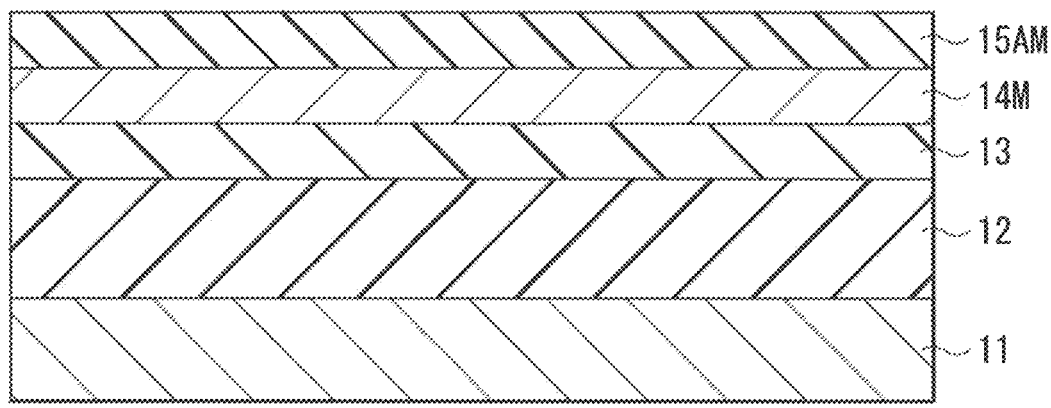
FIG. 4B is a schematic cross-sectional view of the thin film transistor illustrated in FIG. 1, for illustrating an example process following the process of FIG. 4A.

First, with reference to FIG. 4A, the UC film 12 and the insulating film 13 may be formed in this order on the substrate 11. Thereafter, with reference to FIG. 4B, a semiconductor-material film 14M and an insulating-material film 15AM may be formed sequentially in this order on the insulating film 13. In a subsequent process, the semiconductor-material film 14M may be formed into the semiconductor layer 14, and the insulating-material film 15AM may be formed into the first gate insulating film 15A. In this embodiment of the technology, the semiconductor-material film 14M and the insulating-material film 15AM may be sequentially formed. This protects the surface $S_{14}$ of the semiconductor layer 14 during the manufacturing processing.

Figure 4C:
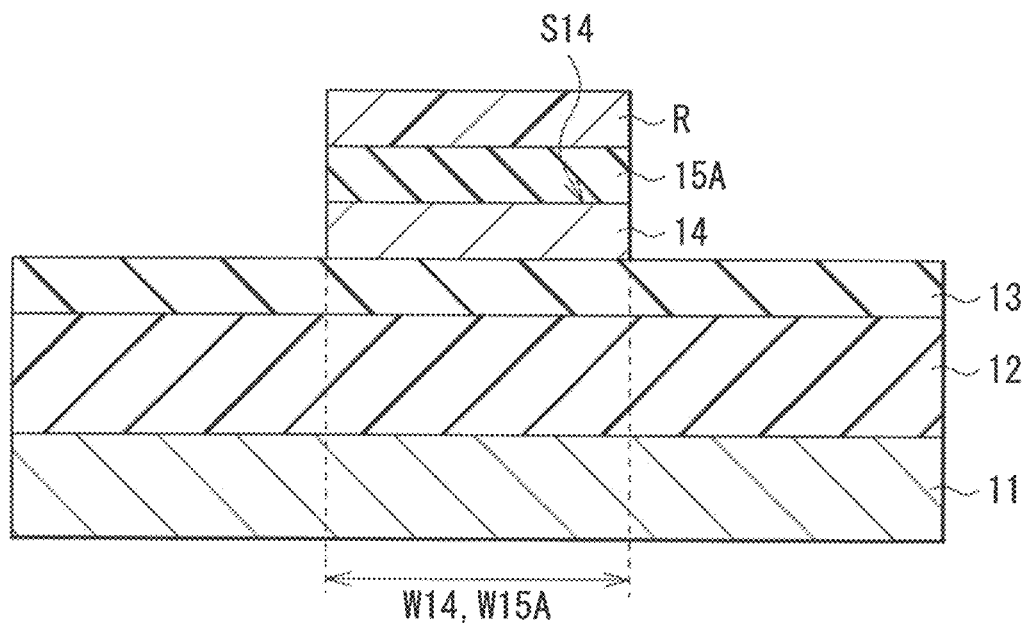
FIG. 4C is a schematic cross-sectional view of the thin film transistor illustrated in FIG. 1, for illustrating an example process following the process of FIG. 4B.

After the formation of the semiconductor-material film 14M and the insulating-material film 15AM, the semiconductor-material film 14M and the insulating-material film 15AM may be patterned in the same process using a resist film R having a predetermined shape, as illustrated in FIG. 4C. For example, the insulating-material film 15AM may be subjected to dry-etching using the resist film R, and thereafter the semiconductor-material film 14M may be subjected to wet-etching using the resist film R. Thereafter, the resist film R may be removed, and annealing may be performed. Through these processes, the semiconductor layer 14 and the first gate insulating film 15A that have planar shapes identical to each other may be formed in the same process. In this embodiment of the technology, the surface $S_{14}$ of the semiconductor layer 14 may be covered by the first gate insulating film 15A. This suppresses adhesion of residual substances of the resist film R to the surface $S_{14}$ of the semiconductor layer 14 and occurrence of a defect on the surface $S_{14}$ of the semiconductor layer 14 due to the annealing, for example.

Figure 4D:
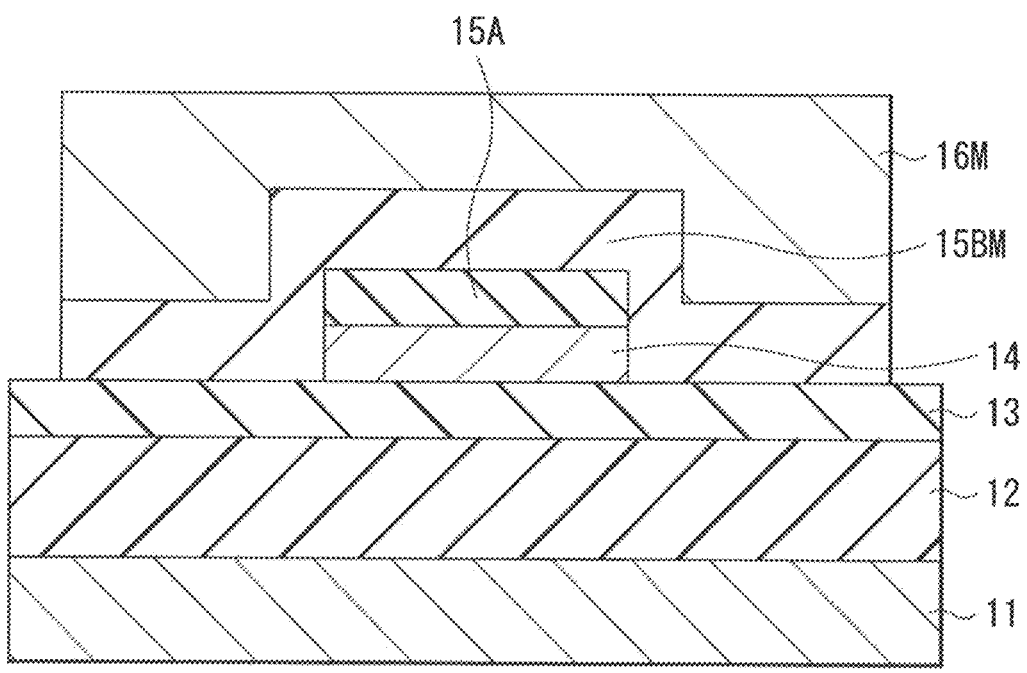
FIG. 4D is a schematic cross-sectional view of the thin film transistor illustrated in FIG. 1, for illustrating an example process following the process of FIG. 4C.

After the formation of the semiconductor layer 14 and the first gate insulating film 15A in the same process, an insulating-material film 15BM and an electrically-conductive-material film 16M may be formed in this order so as to extend over the entire top surface of the substrate 11 and cover the semiconductor layer 14 and the first gate insulating film 15A, as illustrated in FIG. 4D. The insulating-material film 15BM may cover a top surface and end faces of the first gate insulating film 15A and end faces of the semiconductor layer 14. In a subsequent process, the insulating-material film 15BM and the electrically-conductive-material film 16M may be processed into the second gate insulating film 15B and the gate electrode 16, respectively.

After the formation of the insulating-material film 15BM and the electrically-conductive-material film 16M, the insulating-material film 15BM and the electrically-conductive-material film 16M may be patterned in sequence. For example, a resist film having a predetermined shape may be formed on the electrically-conductive-material film 16M, and thereafter the electrically-conductive-material film 16M and the insulating-material film 15BM may be etched in this order using the resist film. Through these processes, the gate electrode 16 and the second gate insulating film 15B may be formed that have planar shapes identical to each other.

Thereafter, the interlayer insulating film 17 may be formed so as to extend over the entire top surface of the substrate 11. At the end of the manufacturing processing, the source-drain electrodes 18 may be formed on the interlayer insulating film 17 to produce the thin film transistor 1 illustrated in FIGS. 1 to 3.

[Workings and Effects]

In the thin film transistor 1 according to any embodiment of the technology, the channel region of the semiconductor layer 14 may be activated in response to application of a voltage exceeding a threshold to the gate electrode 16. This causes a current to flow between the paired source-drain electrodes 18.

In the thin film transistor 1, the first gate insulating film 15A and the second gate insulating film 15B may be provided between the semiconductor layer 14 and the gate electrode 16. The first gate insulating film 15A and the semiconductor layer 14 may be formed in the same process. The first gate insulating film 15A may cover the surface $S_{14}$ of the semiconductor layer 14. Accordingly, the surface $S_{14}$ of the semiconductor layer 14 may be protected by the first gate insulating film 15A immediately after the formation of the semiconductor layer 14. Some workings and effects of the technology will now be described with reference to a comparative example.

Figure 5:
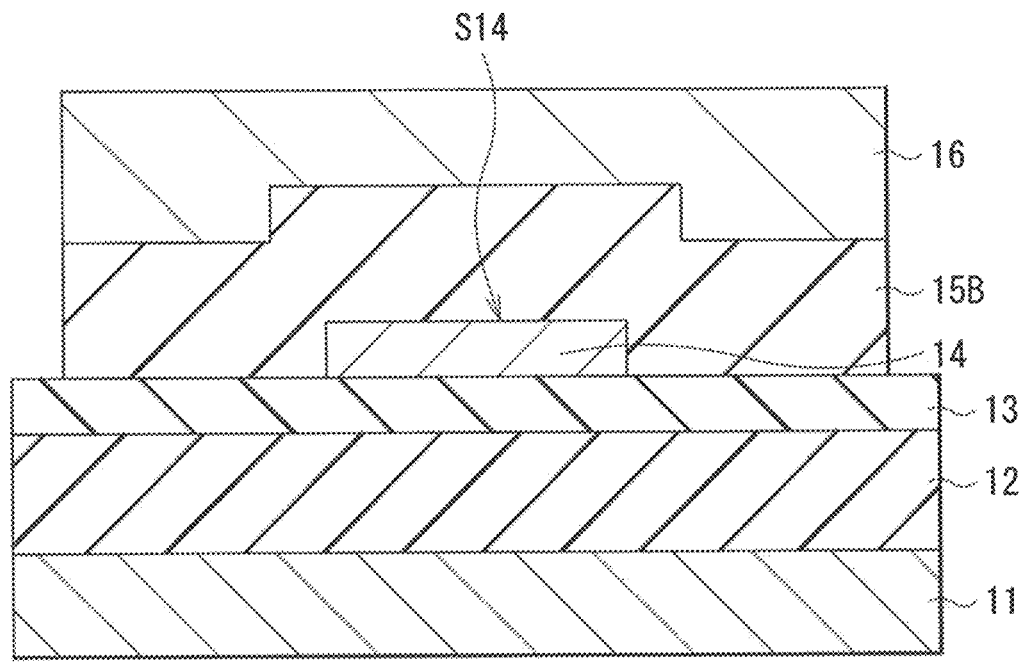
FIG. 5 is a schematic cross-sectional view, taken along the channel width direction, of a thin film transistor of a comparative example.

FIG. 5 is a schematic cross-sectional view of a thin film transistor 100 of a comparative example, taken along the Y-Z plane extending in the channel width direction. The thin film transistor 100 includes only the second gate insulating film 15B between the semiconductor layer 14 and the gate electrode 16. In other words, in the thin film transistor 100, the second gate insulating film 15B is in contact with the surface $S_{14}$ of the semiconductor layer 14.

The thin film transistor 100 is manufactured through the following processes, for example.

Figure 6:
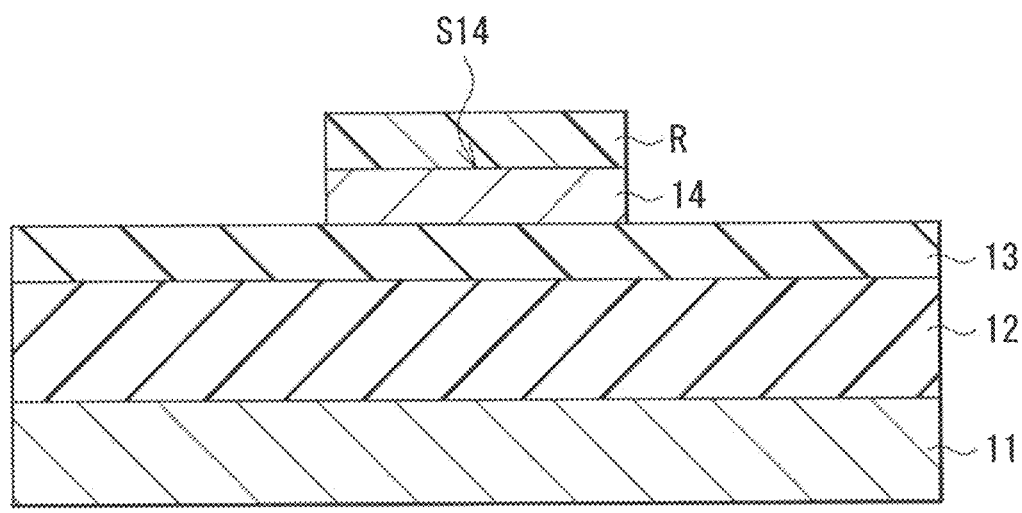
FIG. 6 is a schematic cross-sectional view of the thin film transistor illustrated in FIG. 5, for illustrating an example process of a manufacturing method of the thin film transistor according to one embodiment of the technology.

First, with reference to FIG. 4A, the UC film 12 and the insulating film 13 are formed on the substrate 11, as in the thin film transistor 1. Thereafter, with reference to FIG. 6, the semiconductor layer 14 is formed on the UC film 12, using the resist film R having a predetermined shape. Thereafter, the resist film R is removed, and annealing is performed. Thereafter, the second gate insulating film 15B and the gate electrode 16 are formed, as in the thin film transistor 1.

As described above, in the manufacturing method of the thin film transistor 100 according to the comparative example, the semiconductor layer 14 is patterned while the surface $S_{14}$ of the semiconductor layer 14 is not covered with the first gate insulating film 15A of FIG. 4C. This may possibly cause adhesion of residual substances of the resist film R to the surface $S_{14}$ of the semiconductor layer 14 or a defect on the surface $S_{14}$ of the semiconductor layer 14 due to the annealing. The defect on the surface $S_{14}$ of the semiconductor layer 14 may possibly cause characteristic degradation in, for example, mobility and an S value, of the thin film transistor 100.

In contrast, in the manufacturing method of the thin film transistor 1 according to any embodiment of the technology, the semiconductor layer 14 may be patterned while the surface $S_{14}$ of the semiconductor layer 14 (i.e., the semiconductor-material film 14M) is coved with the first gate insulating film 15A (i.e., the insulating-material film 15AM). This suppresses adhesion of residual substances of the resist film R to the surface $S_{14}$ of the semiconductor layer 14 and occurrence of a defect on the surface $S_{14}$ of the semiconductor layer 14 due to the annealing, for example.

Figure 7A:
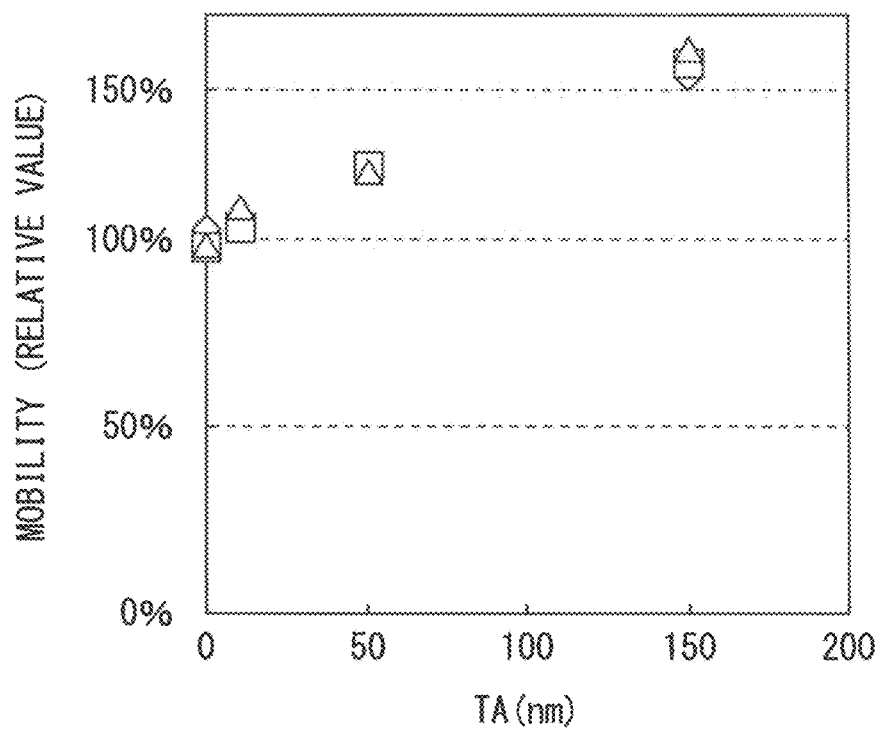
FIG. 7A is a graph illustrating example mobility of each of the thin film transistors illustrated in FIGS. 1 and 5.
Figure 7B:
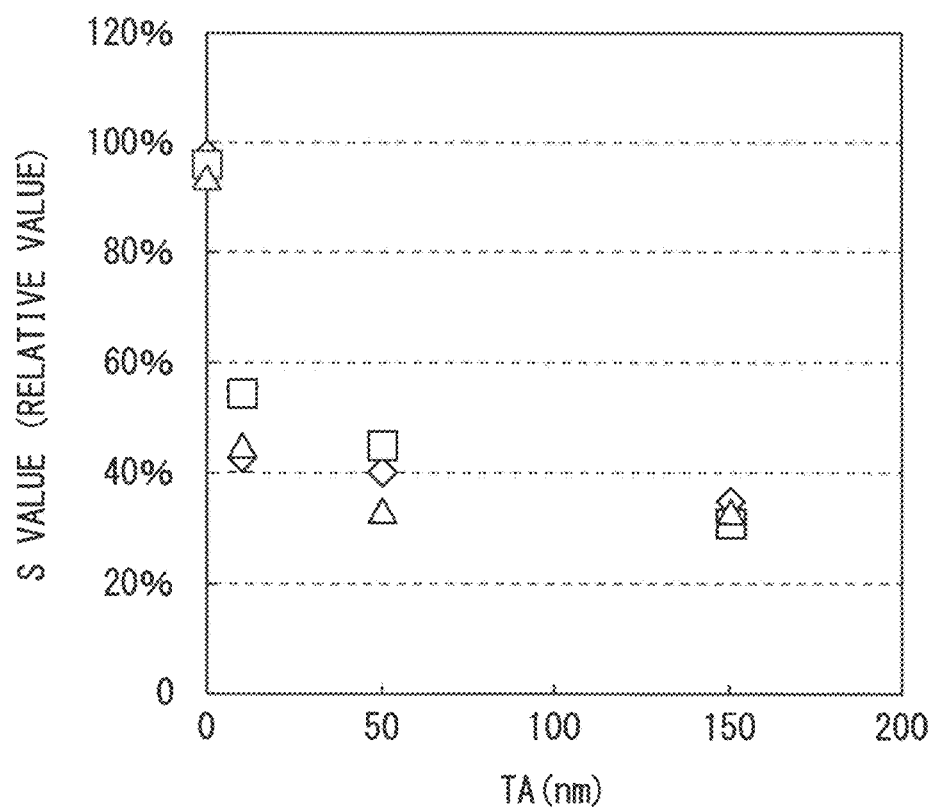
FIG. 7B is a graph illustrating an example S value of each of the thin film transistors illustrated in FIGS. 1 and 5.

FIGS. 7A and 7B illustrate characteristics of the thin film transistors 1 and 100 in correlation with variation in the thickness TA of the first gate insulating film 15A. FIG. 7A illustrates mobility of each of the thin film transistors 1 and 100. FIG. 7B illustrates an S value of each of the thin film transistors 1 and 100. In FIGS. 7A and 7B, the total of the thickness TA of the first gate insulating film 15A and the thickness TB of the second gate insulating film 15B is 200 nm. For the thin film transistor 100, the thickness TA of the first gate insulating film 15A is 0 nm, that is, only the second gate insulating film 15B is provided.

As illustrated in FIGS. 7A and 7B, the thin film transistor 1 including the first gate insulating film 15A has an improved S value, compared with the thin film transistor 100 without the first gate insulating film 15A. Further, the characteristic of the thin film transistor 1 is improved as the thickness TA of the first gate insulating film 15A becomes greater than the thickness TB of the second gate insulating film 15B: for example, the thickness TA may be set to 150 nm, and the thickness TB to 50 nm.

As described above, the first gate insulating film 15A and the second gate insulating film 15B are provided between the semiconductor layer 14 and the gate electrode 16 in any embodiment of the technology. This suppresses occurrence of a defect on the surface $S_{14}$ of the semiconductor layer 14 during the manufacturing processing. Accordingly, it is possible to suppress characteristic degradation in, for example, mobility and the S value, of the thin film transistor 1.

Additionally, the end faces of the semiconductor layer 14 that are uncovered with the first gate insulating film 15A are covered with the second gate insulating film 15B in any embodiment of the technology. Accordingly, it is possible to suppress occurrence of a short circuit between each of the end faces of the semiconductor layer 14 and the gate electrode 16.

Application Examples

The thin film transistor 1 according to any embodiment of the technology may be applicable to a driving circuit in a display unit (e.g., a display unit 2A of FIG. 8 described below) or an imaging unit (e.g., an imaging unit 2B of FIG. 9 described below), for example.

Figure 8:
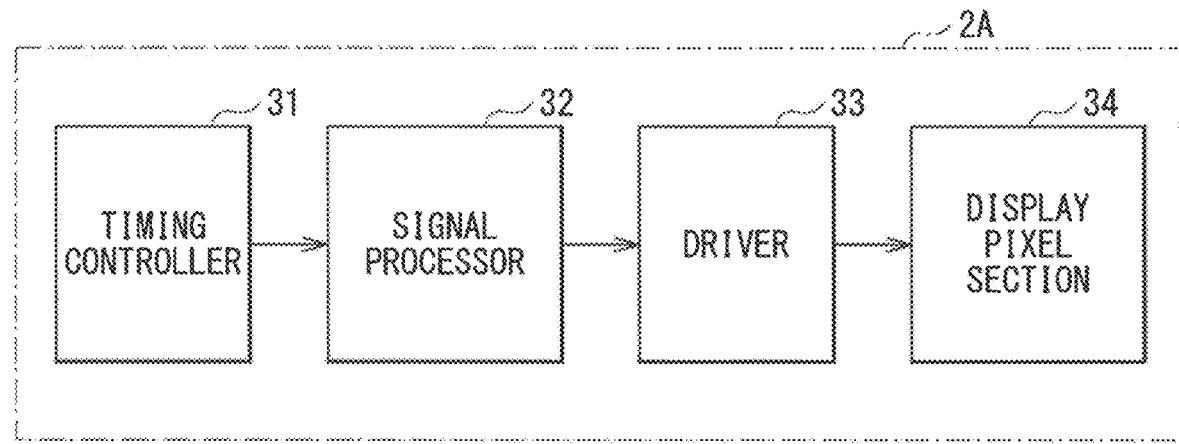
FIG. 8 is a block diagram of an example display unit to which a thin film transistor according to one embodiment of the technology is applied.

FIG. 8 is a block diagram of the display unit 2A having an example configuration according to an embodiment of the technology. The display unit 2A may display images based on external or internal image signals. For example, the display unit 2A may be applied to a liquid crystal display as well as the organic EL display described above. The display unit 2A may include, for example, a timing controller 31, a signal processor 32, a driver 33, and a display pixel section 34.

The timing controller 31 may include a timing generator that generates various timing signals or control signals, and control driving of the signal processor 32 on the basis of these timing signals, for example. The signal processor 32 may perform a predetermined correction on a digital image signal received from an external device, and output the corrected image signal to the driver 33. The driver 33 may include a scanning-line driving circuit and a signal-line driving circuit, for example. The driver 33 may drive pixels in the display pixel section 34 through respective control lines. The display pixel section 34 may include display elements, such as organic EL elements or liquid crystal display elements, and circuitry that drives the display elements for each pixel, for example. The thin film transistor 1 according to any embodiment of the technology may be used in any circuitry in the driver 33 or the display pixel section 34, for example.

Figure 9:
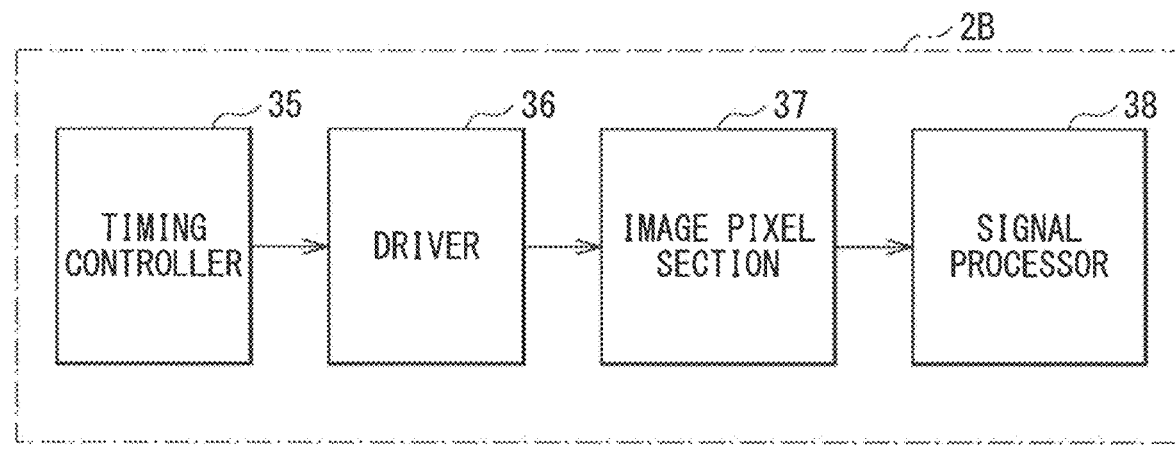
FIG. 9 is a block diagram of an example imaging unit to which a thin film transistor according to one embodiment of the technology is applied.

FIG. 9 is a block diagram of the imaging unit 2B having an example configuration according to an embodiment of the technology. The imaging unit 2B may be a solid-state imaging unit that acquires images in the form of electric signals, for example. The imaging unit 2B may include a charge-coupled device (CCD) or a complementary metal oxide semiconductor (CMOS) image sensor. The imaging unit 2B may include a timing controller 35, a driver 36, an image pixel section 37, and a signal processor 38.

The timing controller 35 may include a timing generator that generates various timing signals or control signals, and control driving of the driver 36 on the basis of these timing signals. The driver 36 may include a row-selection circuit, an AD conversion circuit, and a horizontal transfer scanning circuit, for example. The driver 36 may read a signal from any pixel in the image pixel section 37 through corresponding one of control lines. The image pixel section 37 may include imaging elements such as photodiodes (e.g., photoelectric conversion elements) and a pixel circuit to read signals, for example. The signal processor 38 may perform various signal processing on the signal received from the image pixel section 37. The thin film transistor 1 according to any embodiment of the technology may be applied to circuitry in the driver 36 or the image pixel section 37, for example.

[Example Electronic Apparatuses]

Figure 10:
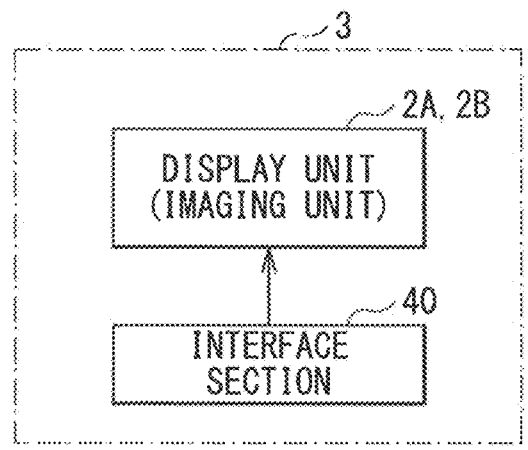
FIG. 10 is a block diagram of an electronic unit having an example configuration according to one embodiment of the technology.

The display unit 2A or the imaging unit 2B according to any embodiment of the technology may be applied to a variety of electronic apparatuses. FIG. 10 is a block diagram of an electronic apparatus 3 having an example configuration according to an embodiment of the technology. Specific but non-limiting examples of the electronic apparatus 3 include television sets, personal computers (PCs), smartphones, tablet PCs, mobile phones, digital still cameras, and digital video cameras.

The electronic apparatus 3 may include, for example, the display unit 2A or the imaging unit 2B of any embodiment of the technology, and an interface section 40. The interface section 40 may be an input section that receives various external signals and external electric power. Optionally, the interface section 40 may include, for example, a user interface section such as a touch panel, a keyboard, or operation buttons.

Although the technology has been described with reference to at least one embodiment, the technology is not limited thereto, but may be modified in a wide variety of ways. For example, factors such as a material and a thickness of each layer exemplified in any foregoing embodiment, etc. are illustrative and non-limiting. Any other material and any other thickness may be adopted besides those described above.

It should be appreciated that the effects described herein are mere examples. Effects of an embodiment of the technology are not limited to those described herein. The technology may further include any effect other than those described herein.

It is possible to achieve at least the following configurations from the above-described example embodiments of the technology.

(1) A thin film transistor including:
  a substrate;
  a semiconductor layer provided in a selective region of the substrate;
  a first gate insulating film provided in the selective region of the substrate and covering a surface of the semiconductor layer;
  a second gate insulating film extending across opposite sides of the first gate insulating film along a channel width direction and covering the first gate insulating film that covers the semiconductor layer; and
  a gate electrode facing the semiconductor layer across the second gate insulating film.

(2) The thin film transistor according to (1), in which the first gate insulating film has a planar shape a same as a planar shape of the semiconductor layer.

(3) The thin film transistor according to (1) or (2), in which the second gate insulating film has a width greater than a width of the semiconductor layer, along the channel width direction.

(4) The thin film transistor according to any one of (1) to (3), in which the second gate insulating film is provided between each of end faces of the semiconductor layer and the gate electrode, the end faces of the semiconductor layer being oriented in the channel width direction.

(5) The thin film transistor according to any one of (1) to (4), in which the second gate insulating film has a planar shape a same as a planar shape of the gate electrode.

(6) The thin film transistor according to any one of (1) to (5), in which the second gate insulating film includes an insulating material a same as a material of the first gate insulating film.

(7) The thin film transistor according to any one of (1) to (6), in which the second gate insulating film has a thickness different from a thickness of the first gate insulating film.

(8) The thin film transistor according to any one of (1) to (7), in which the second gate insulating film has a thickness greater than a thickness of the first gate insulating film.

(9) The thin film transistor according to any one of (1) to (7), in which the first gate insulating film has a thickness greater than a thickness of the second gate insulating film.

(10) The thin film transistor according to any one of (1) to (9), in which the semiconductor layer includes an oxide semiconductor material.

(11) A display unit provided with a display element and a thin film transistor configured to drive the display element, the thin film transistor including:

a substrate;
a semiconductor layer provided in a selective region of the substrate;
a first gate insulating film provided in the selective region of the substrate and covering a surface of the semiconductor layer;
a second gate insulating film extending across opposite sides of the first gate insulating film along a channel width direction and covering the first gate insulating film that covers the semiconductor layer; and
a gate electrode facing the semiconductor layer across the second gate insulating film.

In the thin film transistor and the display unit according to any embodiment of the technology, the first gate insulating film and the second gate insulating film are provided between the semiconductor layer and the gate electrode. This configuration allows the semiconductor layer and the first gate insulating film to be formed in the same process, and the surface of the semiconductor layer to be protected by the first gate insulating film immediately after the formation of the semiconductor layer.

In the thin film transistor and the display unit according to any embodiment of the technology, the first gate insulating film and the second gate insulating film are provided between the semiconductor layer and the gate electrode. This configuration suppresses occurrence of a defect on a surface of the semiconductor layer during the manufacturing processing. Accordingly, it is possible to suppress characteristic degradation in, for example, mobility and an S value, of the thin film transistor.

Note that effects of the technology are not limited to those described hereinabove, and may be any effect described herein.

Although the technology has been described in terms of example embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. Moreover, no element or component in this technology is intended to be dedicated to the public regardless of whether the element or component is explicitly recited in the following claims.

What is claimed is:

1. A thin film transistor comprising:
a substrate;
a semiconductor layer provided in a selective region of the substrate;
a first gate insulating film provided in the selective region of the substrate and covering a surface of the semiconductor layer;
a second gate insulating film extending continuously beyond opposite sides of the first gate insulating film along a channel width direction and covering the first gate insulating film that covers the surface of the semiconductor layer; and
a gate electrode facing the semiconductor layer across the second gate insulating film.

2. The thin film transistor according to claim 1, wherein the first gate insulating film has a planar shape a same as a planar shape of the semiconductor layer.

3. The thin film transistor according to claim 1, wherein the second gate insulating film has a width greater than a width of the semiconductor layer, along the channel width direction.

4. The thin film transistor according to claim 1, wherein the second gate insulating film is provided between a first end face of the semiconductor layer and the gate electrode, and between a second end face of the semiconductor layer and the gate electrode, the first and second end faces of the semiconductor layer being oriented in the channel width direction.

5. The thin film transistor according to claim 1, wherein the second gate insulating film has a planar shape a same as a planar shape of the gate electrode.

6. The thin film transistor according to claim 1, wherein the second gate insulating film includes an insulating material a same as a material of the first gate insulating film.

7. The thin film transistor according to claim 1, wherein the second gate insulating film has a thickness different from a thickness of the first gate insulating film.

8. The thin film transistor according to claim 1, wherein the second gate insulating film has a thickness greater than a thickness of the first gate insulating film.

9. The thin film transistor according to claim 1, wherein the first gate insulating film has a thickness greater than a thickness of the second gate insulating film.

10. The thin film transistor according to claim 1, wherein the semiconductor layer includes an oxide semiconductor material.

11. The thin film transistor according to claim 1, wherein the first gate insulating film is between the semiconductor layer and the second gate insulating film.

12. The thin film transistor according to claim 1, wherein the first gate insulating film includes
one face facing the semiconductor layer,
another face opposite to the one face and facing the second gate insulating film, and
two side faces opposite to each other in the channel width direction, each of the two side faces connecting the one face and the another face, and
the second gate insulating film covers the another face and the two side faces of the first gate insulating film.

13. The thin film transistor according to claim 12, wherein the semiconductor layer includes
a first end face facing a direction same as one of the two side faces of the first gate insulating film, and
a second end face facing a direction same as the other of the two side faces of the first gate insulating film, and
the second gate insulating film covers the first end face and the second end face of the semiconductor layer.

14. A display unit provided with a display element and a thin film transistor configured to drive the display element, the thin film transistor comprising:
a substrate;
a semiconductor layer provided in a selective region of the substrate;
a first gate insulating film provided in the selective region of the substrate and covering a surface of the semiconductor layer;
a second gate insulating film extending continuously beyond opposite sides of the first gate insulating film along a channel width direction and covering the first gate insulating film that covers the surface of the semiconductor layer; and a gate electrode facing the semiconductor layer across the second gate insulating film.

15. The thin film transistor according to claim 14, wherein the first gate insulating film is between the semiconductor layer and the second gate insulating film.

16. The thin film transistor according to claim 14, wherein the first gate insulating film includes one face facing the semiconductor layer, another face opposite to the one face and facing the second gate insulating film, and two side faces opposite to each other in the channel width direction, each of the two side faces connecting the one face and the another face, and the second gate insulating film covers the another face and the two side faces of the first gate insulating film.

17. The thin film transistor according to claim 16, wherein the semiconductor layer includes a first end face facing a direction same as one of the two side faces of the first gate insulating film, and a second end face facing a direction same as the other of the two side faces of the first gate insulating film, and the second gate insulating film covers the first end face and the second end face of the semiconductor layer.

* * * * *